(12) United States Patent
Zhao et al.

(10) Patent No.: US 11,163,203 B2
(45) Date of Patent: Nov. 2, 2021

(54) COA SUBSTRATE AND METHOD OF FABRICATING SAME

(71) Applicant: TCL CHINA STAR OPTOELECTRONICS TECHNOLOGY CO., LTD., Shenzhen (CN)

(72) Inventors: Ting Zhao, Shenzhen (CN); Guo Zhao, Shenzhen (CN)

( * ) Notice: Subject to any disclaimer, the term of this patent is extended or adjusted under 35 U.S.C. 154(b) by 0 days.

(21) Appl. No.: 16/627,351

(22) PCT Filed: Dec. 18, 2019

(86) PCT No.: PCT/CN2019/126253
§ 371 (c)(1),
(2) Date: Dec. 30, 2019

(65) Prior Publication Data
US 2021/0173266 A1 Jun. 10, 2021

(30) Foreign Application Priority Data
Dec. 6, 2019 (CN) .......................... 201911242640.2

(51) Int. Cl.
*G02F 1/1362* (2006.01)
*H01L 27/12* (2006.01)

(52) U.S. Cl.
CPC .... *G02F 1/136222* (2021.01); *H01L 27/1222* (2013.01); *H01L 27/1288* (2013.01)

(58) Field of Classification Search
CPC ........... G02F 1/136222; H01L 27/1222; H01L 27/1288
See application file for complete search history.

(56) References Cited

U.S. PATENT DOCUMENTS

| 6,577,374 B1* | 6/2003 | Nakata | G02F 1/136227 349/156 |
| 2003/0013236 A1* | 1/2003 | Nakata | H01L 27/1244 438/149 |
| 2005/0219433 A1* | 10/2005 | Oh | G02F 1/136227 349/42 |
| 2006/0181667 A1* | 8/2006 | Doi | G02F 1/13392 349/155 |
| 2010/0059752 A1* | 3/2010 | Lee | G02F 1/136209 257/59 |

(Continued)

FOREIGN PATENT DOCUMENTS

| CN | 106444190 A | 2/2017 |
| CN | 106783876 A | 5/2017 |
| CN | 107589532 A | 1/2018 |

*Primary Examiner* — Hoan C Nguyen (57) ABSTRACT

A color-filter on array (COA) substrate and a method of fabricating the same are described. A first through hole is disposed in a first passivation layer, a second through hole is disposed in the color resist layer, and a third through hole is disposed in the second passivation layer, wherein the first through hole communicates with the second through hole, and the second through hole communicates with the third through hole to collectively form an opening. A hole diameter of the opening gradually increases from bottom to top. A part of the color resist layer is etched while the second passivation layer is etched so as to reduce a taper angle of the opening. Therefore, a relatively large impedance value impedance or disconnection is avoided when depositing a pixel electrode.

12 Claims, 3 Drawing Sheets

(56) References Cited

U.S. PATENT DOCUMENTS

| | | | |
|---|---|---|---|
| 2013/0222723 A1* | 8/2013 | Kim | H01L 33/58 349/40 |
| 2014/0054555 A1* | 2/2014 | Kim | H01L 27/322 257/40 |
| 2016/0005799 A1* | 1/2016 | Wang | H01L 27/32 257/40 |
| 2017/0293190 A1* | 10/2017 | Kim | G02F 1/13394 |
| 2019/0072696 A1 | 3/2019 | Li et al. | |

* cited by examiner

COA SUBSTRATE AND METHOD OF FABRICATING SAME

CROSS REFERENCE TO RELATED APPLICATION

This application claims priority to a Chinese patent application filed with the China National Intellectual Property Administration on Dec. 6, 2019, with an application number of 201911242640.2, and a disclosure name is "COA SUBSTRATE AND METHOD OF FABRICATING SAME", an entire content of which is incorporated herein by reference.

FIELD OF DISCLOSURE

The present disclosure relates to displays, and more particularly to a color-filter on array (COA) substrate and a method of fabricating the same.

BACKGROUND OF DISCLOSURE

Color-filter on array (COA) technology is an integrated technology in which a color resist layer is directly fabricated on an array substrate, which can effectively solve problems such as light leakage caused by misalignment in a process of liquid crystal display device alignment. It can significantly improve a display aperture ratio. Under a premise of high resolution and high frequency of a panel, the COA technology has its irreplaceable advantages.

Figure 1:
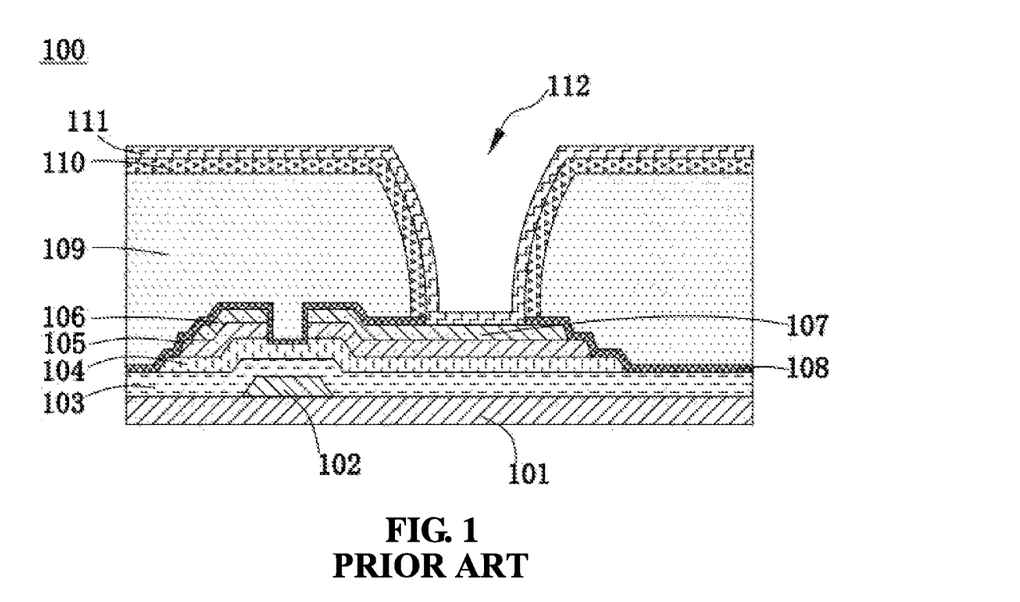
FIG. 1 is a schematic cross-sectional structural diagram of a color-filter on array (COA) substrate of conventional technologies.
Figure 2:
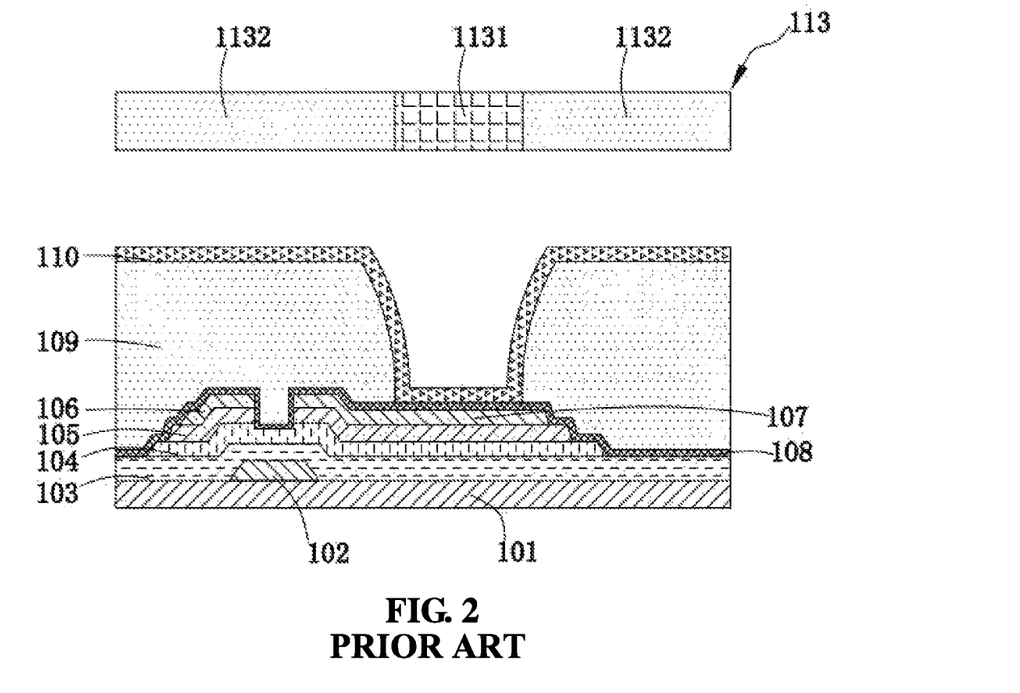
FIG. 2 is a schematic diagram of an aligned positional relationship between a half tone mask of conventional technologies and a second passivation layer of the COA substrate in FIG. 1.

In order to make the pixel electrode and the metal electrode conductive with each other, as shown in FIG. 1, a cross-sectional structure diagram of a conventional COA substrate 100 is shown. The COA substrate 100 includes a base substrate 101, wherein a gate electrode 102, a gate electrode insulating layer 103, an active layer 104, an ohmic contact layer 105, a source electrode 106, and a drain electrode 107 are sequentially formed on the base substrate 101. A CF open 112 is opened at a via hole of the COA substrate 100 and is opened sequentially from the top to the bottom of the second passivation layer 110, the color resist layer 109, and the first passivation layer 108. Generally, three steps are required to achieve the open 112. In step 1: after the first passivation layer 108 is deposited on the source electrode 106 and the drain electrode 107 of the COA substrate by a chemical vapor deposition method (CVD), the color resist layer 109 is directly deposited on the first passivation layer 108, and then the color resist layer 109 is opened through an exposure and development process. In step 2, the second passivation layer 110 is continued to be deposited on the color resist layer 109, and then a photoresist is coated, as shown in FIG. 2. Further, exposure and development are performed through the half-tone mask 113 to achieve a patterned design, wherein an area on the half-tone mask 113 aligned to an opening of the first passivation layer is a light-transmitting area 1131, and areas on both sides of the light-transmissive area 1131 are opaque areas 1132. In step 3, the first passivation layer 108 and the second passivation layer 110 are etched, and a portion without being covered with the photoresist, that is, the second passivation layer 110 and the first passivation layer 108 located at the via hole are sequentially etched away, and finally the photoresist is peeled to obtain the open 112.

However, a thickness of the color resist layer 109 of the COA substrate 100 is usually 3 um, a thickness of the pixel electrode 111 is about 0.05 um. A thickness difference between the color resist layer 109 and the pixel electrode 111 reaches 60 times, which causes a taper angle of the open 112 to be too large, which in turn causes a phenomenon of uneven coverage, relatively large resistance, or even disconnection during subsequent deposition of the pixel electrode 111, which affects a display effect.

From above, there is a need to provide a new COA substrate and a method of fabricating the same to solve the above technical problems.

SUMMARY OF DISCLOSURE

A color-filter on array (COA) substrate provided by the present disclosure and a method of fabricating the same solve the technical problems of the existing COA substrate, which causes a taper angle of the formed open to be too large, which in turn causes a phenomenon of uneven coverage, relatively large resistance, or even disconnection during subsequent deposition of the pixel electrode, which affects a display effect.

In order to solve the above problems, technical solutions provided by the present disclosure are as follows:

An embodiment of the present disclosure provides a method of fabricating a color-filter on array (COA) substrate, comprising steps of:

a step S10 of forming a gate electrode on a base substrate;

a step S20 of forming a gate electrode insulating layer on the base substrate and the gate electrode;

a step S30 of forming an active layer on the gate electrode insulating layer;

a step S40 of forming an ohmic contact layer on the active layer;

a step S50 of forming a source electrode and a drain electrode on the ohmic contact layer;

a step S60 of forming a first passivation layer on the source electrode, the drain electrode, the gate electrode insulating layer, the active layer, and the ohmic contact layer;

a step S70 of forming a color resist layer on the first passivation layer, and forming an auxiliary through hole in the color resist layer through an exposure and development process, wherein an inner wall of the auxiliary through hole is arc-shaped;

a step S80 of forming a second passivation layer on the color resist layer; and a step S90 of forming a photoresist on the second passivation layer, exposing the photoresist with a halftone mask, and sequentially forming a third through hole on the second passivation layer, forming a second through hole on the color resist layer, and forming a first through hole on the first passivation layer through an etching process, wherein the first through hole communicates with the second through hole and the second through hole communicates with the third through hole to form an opening, wherein the inner wall of the opening is a continuous arc shape, and a hole diameter of the opening gradually increases from bottom to top.

According to a method of fabricating the COA substrate provided by an embodiment of the present disclosure, the halftone mask comprises a light-transmitting area, a partially light-transmitting area, and an opaque area, wherein a light transmission degree of the light-transmitting area is greater than a light transmission degree of the partially light-transmitting area, and the light transmission degree of the partially light-transmitting area is greater than a light transmission degree of the opaque area.

According to a method of fabricating the COA substrate provided by an embodiment of the present disclosure, the light-transmitting area is aligned to the first through hole, the partially light-transmitting area is aligned to the third through hole, and the opaque area is aligned to the second passivation layer from which the third through hole is removed.

According to a method of fabricating the COA substrate provided by an embodiment of the present disclosure, an upper end hole diameter of the second through hole is greater than an upper end hole diameter of the auxiliary through hole.

According to a method of fabricating the COA substrate provided by an embodiment of the present disclosure, the method further comprises a step S100 of: peeling off the photoresist, and forming a pixel electrode on the second passivation layer, the inner wall of the opening, and the drain electrode aligned to the first through hole by a physical vapor deposition process, wherein the pixel electrode is connected to the drain electrode through the opening.

According to a method of fabricating the COA substrate provided by an embodiment of the present disclosure, the photoresist is a positive photoresist.

According to a method of fabricating the COA substrate provided by an embodiment of the present disclosure, the etching process in the step S90 is dry etching.

According to a method of fabricating the COA substrate provided by an embodiment of the present disclosure, an upper end hole diameter of the second through hole is greater than an upper end hole diameter of the auxiliary through hole.

An embodiment of the present disclosure provides a color-filter on array (COA) substrate, comprising:
  a base substrate;
  a gate electrode, a gate electrode insulating layer, an active layer, an ohmic contact layer, a source electrode, and a drain electrode sequentially disposed on the base substrate;
  a first passivation layer disposed on the source electrode, the drain electrode, the gate electrode insulating layer, and the active layer;
  a color resist layer disposed on the first passivation layer; and
  a second passivation layer disposed on the color resist layer,
  wherein a first through hole is disposed in the first passivation layer, a second through hole is disposed in the color resist layer, and a third through hole is disposed in the second passivation layer, wherein the first through hole communicates with the second through hole, and the second through hole communicates with the third through hole to collectively form an opening, wherein an inner wall of the opening is a continuously distributed arc shape, and a hole diameter of the opening gradually increases from bottom to top.

According to a COA substrate provided by an embodiment of the present disclosure, a pixel electrode is disposed on the second passivation layer, the inner wall of the opening, and the drain electrode aligned to the first through hole.

According to a COA substrate provided by an embodiment of the present disclosure, the pixel electrode is connected to the drain electrode through the opening.

An embodiment of the present disclosure provides a method of fabricating a color-filter on array (COA) substrate, the method further comprises a step of:
  a step S10 of forming a gate electrode on a base substrate;
  a step S20 of forming a gate electrode insulating layer on the base substrate and the gate electrode;
  a step S30 of forming an active layer on the gate electrode insulating layer;
  a step S40 of forming an ohmic contact layer on the active layer;
  a step S50 of forming a source electrode and a drain electrode on the ohmic contact layer;
  a step S60 of forming a first passivation layer on the source electrode, the drain electrode, the gate electrode insulating layer, the active layer, and the ohmic contact layer;
  a step S70 of forming a color resist layer on the first passivation layer, and forming an auxiliary through hole in the color resist layer through an exposure and development process, wherein an inner wall of the auxiliary through hole is arc-shaped;
  a step S80 of forming a second passivation layer on the color resist layer; and
  a step S90 of forming a photoresist on the second passivation layer, exposing the photoresist with a halftone mask, and sequentially forming a third through hole on the second passivation layer, forming a second through hole on the color resist layer, and forming a first through hole on the first passivation layer through an etching process, wherein the first through hole communicates with the second through hole and the second through hole communicates with the third through hole to form an opening, wherein the inner wall of the opening is a continuous arc shape, and a hole diameter of the opening gradually increases from bottom to top.

According to a method of fabricating the COA substrate provided by an embodiment of the present disclosure, the halftone mask comprises a light-transmitting area, a partially light-transmitting area, and an opaque area, wherein a light transmission degree of the light-transmitting area is greater than a light transmission degree of the partially light-transmitting area, and the light transmission degree of the partially light-transmitting area is greater than a light transmission degree of the opaque area.

According to a method of fabricating the COA substrate provided by an embodiment of the present disclosure, the light-transmitting area is aligned to the first through hole, the partially light-transmitting area is aligned to the third through hole, and the opaque area is aligned to the second passivation layer from which the third through hole is removed.

According to a method of fabricating the COA substrate provided by an embodiment of the present disclosure, an upper end hole diameter of the second through hole is greater than an upper end hole diameter of the auxiliary through hole.

According to a method of fabricating the COA substrate provided by an embodiment of the present disclosure, the method further comprises a step S100 of: peeling off the photoresist, and forming a pixel electrode on the second passivation layer, the inner wall of the opening, and the drain electrode aligned to the first through hole by a physical vapor deposition process, wherein the pixel electrode is connected to the drain electrode through the opening.

According to a method of fabricating the COA substrate provided by an embodiment of the present disclosure, the photoresist is a positive photoresist.

According to a method of fabricating the COA substrate provided by an embodiment of the present disclosure, the etching process in the step S90 is dry etching.

According to a method of fabricating the COA substrate provided by an embodiment of the present disclosure, in the step S60, the first passivation layer is formed by a chemical vapor deposition process.

According to a method of fabricating the COA substrate provided by an embodiment of the present disclosure, an upper end hole diameter of the second through hole is greater than an upper end hole diameter of the auxiliary through hole.

Beneficial effects of the present disclosure are that: the COA substrate and the method of fabricating the same provided by the present disclosure provided by the present disclosure use a half tone mask to expose the second passivation layer, thereby ensuring that during a subsequent etching operation, a part of the color resist layer is etched at the same time when the second passivation layer is etched away, such that the taper angle of the formed opening is reduced. Therefore, the taper angle is reduced when the pixel electrode is deposited, the phenomenon of uneven coverage, relatively large resistance, or even disconnection is avoided when the pixel electrode is deposited, which improves a quality of the COA substrate.

DESCRIPTION OF DRAWINGS

In order to more clearly describe technical solutions in embodiments or in conventional technologies, drawings required to be used for the embodiments in conventional technologies are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Thus, the used directional terms are used to describe and understand the present disclosure, but the present disclosure is not limited thereto. In figures, elements with similar structures are indicated with the same numbers.

The present disclosure focus on a color-filter on array (COA) substrate and a method of fabricating the same of the conventional technologies. Since a taper angle of the formed open is too large, a phenomenon of uneven coverage, relatively large resistance, or even disconnection during subsequent deposition of the pixel electrode are induced, which affects a display effect. The embodiment can solve the defect.

Figure 3:
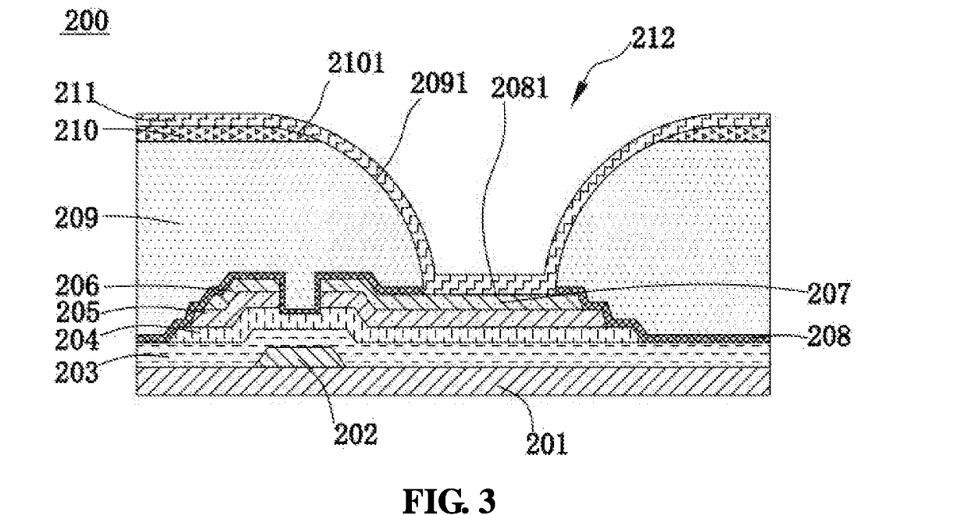
FIG. 3 is a schematic cross-sectional structural diagram of a COA substrate provided by an embodiment of the disclosure.

As shown in FIG. 3, a COA substrate 200 provided by an embodiment of the present disclosure comprises:

a base substrate 201;
a gate electrode 202 located on the base substrate 201;
a gate electrode insulating layer 203 located on the gate electrode 202 and the base substrate 201, wherein the gate electrode insulating layer 203 covers the base substrate 201 and the gate electrode 202;
an active layer 204 located on the gate electrode insulating layer 203 for forming a channel;
an ohmic contact layer 205 located on the active layer 204;
a source electrode 206 and a drain electrode 207 located on the ohmic contact layer 205;
a first passivation layer 208 disposed on the source electrode 206, the drain electrode 207, the gate electrode insulating layer 203, the active layer 204, and the ohmic contact layer 205 for isolating the source electrode 206, the drain electrode 207, and the color resist layer 209; the color resist layer 209 located on the first passivation layer 208 and comprising red, green, and blue color resists arranged in order; and a second passivation layer 210 disposed on the color resist layer 209 for isolating the color resist layer 209 and a pixel electrode 211 located on the second passivation layer 210.

A first through hole 2081 is disposed in the first passivation layer 208 to expose the drain electrode 207. A second through hole 2091 is disposed in the color resist layer 209. A third through hole 2101 is disposed in the second passivation layer 210, wherein the first through hole 2081 communicates with the second through hole 2091, and the second through hole 2091 communicates with the third through hole 2101 to collectively form an opening 212, wherein an inner wall of the opening 212 is a continuously distributed arc shape. That is, the inner wall of the first through hole 2081, the inner wall of the second through hole 2091, and the inner wall of the third through hole 2101 together form a continuously distributed arc shape.

Simultaneously, a pixel electrode 211 is disposed on the second passivation layer 210, the inner wall of the opening 212, and the drain electrode 207 aligned to the first through hole 2081. The pixel electrode 211 is connected to the drain electrode 207 through the opening 212. Material of the pixel electrode 211 can be indium tin oxide (ITO). In other embodiments, ITO can be replaced with other materials as needed, which is not limited herein.

A hole diameter of the opening 212 gradually increases from bottom to top. Specifically, an upper end hole diameter of the first through hole 2081 is smaller than an upper end hole diameter of the second through hole 2091, and the upper end hole diameter of the second through hole 2091 is smaller than an upper end hole diameter of the third through hole 2101, such that the inner wall of the opening 212 is smooth to prevent the inner wall of the opening 212 from forming a discontinuity, so as to avoid the possibility of disconnection due to line-climbing when the pixel electrode 211 is subsequently deposited.

Figure 4:
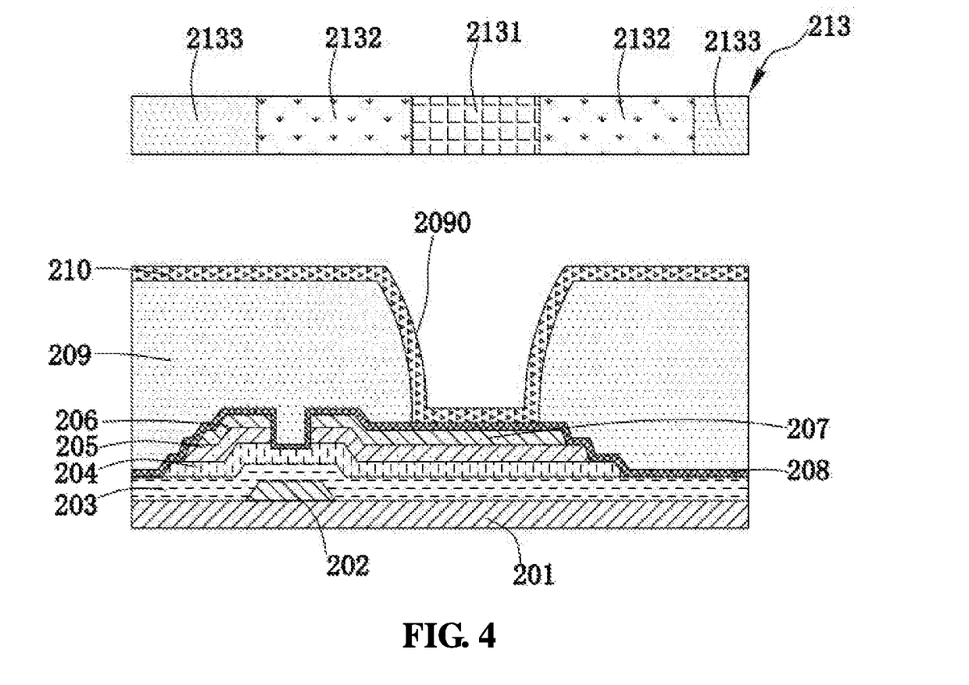
FIG. 4 is a schematic diagram of an aligned positional relationship between the half tone mask provided in the embodiment of the present disclosure and a second passivation layer of the COA substrate in FIG. 4.

Further, FIG. 4 shows a schematic diagram of a positional relationship between the half tone mask 213 aligned to the second passivation layer 210 and the COA substrate 200. The opening 212 is formed through exposure by a half tone mask 213. The halftone mask 213 comprises a light-transmitting area 2131, a partially light-transmitting area 2132, and an opaque area 2133. The partially light-transmitting area 2132 is located on both sides of the light-transmitting area 2131, and the opaque region 2133 is located on both sides of the partially transparent region 2132, wherein a light transmission degree of the light-transmitting area 2131 is greater than a light transmission degree of the partially light-transmitting area 2132, and the light transmission degree of the partially light-transmitting area 2132 is greater than a light transmission degree of the opaque area 2133.

Further, the light-transmitting area 2131 is aligned to the first through hole 2081, the partially light-transmitting area 2132 is aligned to the third through hole 2101, and the opaque area 2133 is aligned to the second passivation layer 210 from which the third through hole 2101 is removed. Therefore, when an etching operation is performed after the second passivation layer 210 is exposed, while the second passivation layer 210 is etched away, a part of the color resist layer 209 will be etched away. Compared with the conventional technologies, the taper angle of the opening 212 formed in the embodiment of the present disclosure is reduced. When the pixel electrode 211 is subsequently deposited, at the same time, the taper angle can be reduced when the pixel electrode 211 is deposited, so as to avoid the phenomenon of uneven coverage, relatively large resistance, or even disconnection. Therefore, quality of the COA substrate 200 is improved.

Figure 5:
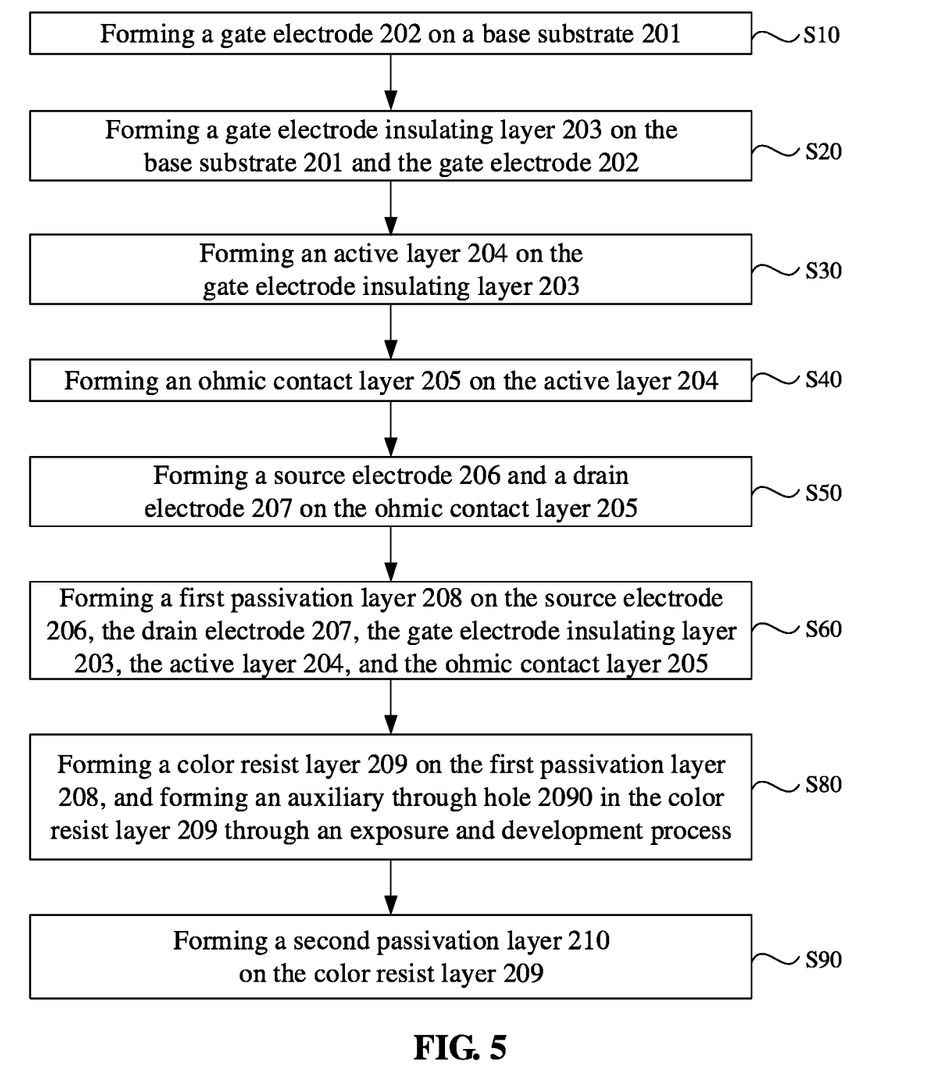
FIG. 5 is a flowchart of a method of fabricating a COA substrate according to an embodiment of the disclosure.

As shown in FIG. 5, a method of fabricating a COA substrate provided by an embodiment of the present disclosure comprises following steps.

In a step S10, a gate electrode 202 is formed on a base substrate 201.

In a step S20, a gate electrode insulating layer 203 is formed on the base substrate 201 and the gate electrode 202.

In a step S30, an active layer 204 is formed on the gate electrode insulating layer 203.

In a step S40, an ohmic contact layer 205 is formed on the active layer 204.

In a step S50, a source electrode 206 and a drain electrode 207 are formed on the ohmic contact layer 205.

In a step S60, a first passivation layer 208 is formed on the source electrode 206, the drain electrode 207, the gate electrode insulating layer 203, the active layer 204, and the ohmic contact layer 205.

Specifically, the first passivation layer 208 can be formed by a chemical vapor deposition (CVD) process. Material of the first passivation layer 208 is at least one of silicon nitride or amorphous silicon nitride.

In a step S70, a color resist layer 209 is formed on the first passivation layer 208, and an auxiliary through hole is formed in the color resist layer through an exposure and development process.

Specifically, the color resist layer 209 is formed on the first passivation layer 208 in a coating manner, and the auxiliary through hole 2090 is formed in the color resist layer 209 through an exposure and development process, wherein an inner wall of the auxiliary through hole 2090 is arc-shaped.

In a step S80, a second passivation layer 210 is formed on the color resist layer 209.

Similarly, the second passivation layer 210 can be formed on the color resist layer 209 by a chemical vapor deposition process. Material of the first passivation layer 208 is at least one of silicon nitride or amorphous silicon nitride.

In a step S90, a photoresist (not shown) is formed on the second passivation layer 210. The photoresist is exposed by a halftone mask 213. A third through hole 2101 is formed in the second passivation layer 210, a second through hole 2091 is formed in the color resist layer 209, and a first through hole 2081 is formed in the first passivation layer 208 through an etching process, sequentially. The first through hole 2081 communicates with the second through hole 2091 and the second through hole 2091 communicates with the third through hole 2101 to form an opening 212, wherein the inner wall of the opening 212 is a continuous arc shape, and a hole diameter of the opening 212 gradually increases from bottom to top.

Specifically, a layer of the photoresist is coated on the second passivation layer 210, and the photoresist is exposed by using the half tone mask 213. A specific structure of the half tone mask 213 has been described in the Embodiment 1. For details, refer to a foregoing description of the half tone mask 213, and details are not described herein again.

The photoresist used is a positive photoresist, and a part of the photoresist irradiated by an ultraviolet light can be etched by a developing solution, while an unexposed part of the photoresist is not etched by the developing solution. Since the partially light-transmitting area 2132 of the half tone mask 213 is aligned to a part of the second passivation layer 210 and a part of the color resist layer 209, the photoresist on the second passivation layer 210 aligned to the partially light-transmitting area 2132 is etched. Therefore, the second passivation layer 210 not covered by the photoresist is etched away by an etching process to form the third through hole 2101. Further, after the second passivation layer 210 is etched away, a part of the color resist layer 209 will also be etched away, so that a hole diameter of the auxiliary through hole 2090 is enlarged to form the second through hole 2091, wherein an upper end hole diameter of the second through hole 2091 is greater than an upper end hole diameter of the auxiliary through hole 2090.

Also, since the light-transmitting area 2131 of the half tone mask 213 is aligned to a part of the second passivation layer 210 and a part of the first passivation layer 208, the photoresist on the second passivation layer 210 aligned to the partially light-transmitting area 2132 is etched. Therefore, the second passivation layer 210 and the first passivation layer 208 which are not covered by the photoresist are sequentially etched by an etching process to form the first through hole 2081, wherein the etching is performed. The etching process is performed using dry etching.

The first through hole 2081 communicates with the second through hole 2091 and the second through hole 2091 communicates with the third through hole 2101 to form the opening 212, wherein the inner wall of the opening 212 is a continuous arc shape, and a hole diameter of the opening 212 gradually increases from bottom to top. Since the upper end hole diameter of the second through hole 2091 formed by using the half tone mask 213 is greater than the upper end hole diameter of the auxiliary through hole 2090, the taper angle of the opening 212 is greatly reduced compared with the conventional technologies.

Further, the method of fabricating the COA substrate 200 further comprises a step S100 of peeling off the photoresist, and forming a pixel electrode 211 on the second passivation layer 210, the inner wall of the opening 212, and the drain electrode 207 aligned to the first through hole 2081 by a physical vapor deposition process, wherein the pixel electrode 211 is connected to the drain electrode 207 through the opening 212.

Specifically, the pixel electrode is connected to the drain electrode 207 through the opening 212. Material of the pixel electrode 211 can be ITO. In other embodiments, ITO can be replaced with other materials as needed, which is not limited herein.

When the pixel electrode 211 is deposited on the inner wall of the opening 212, since the taper angle of the opening 212 is greatly reduced compared to the conventional technologies, the taper angle is greatly reduced compared with the conventional technologies when the pixel electrode 211 is deposited, which can avoid a phenomenon of uneven coverage, relatively large resistance, or even disconnection during deposition of the pixel electrode 211, thereby improving the quality of the COA substrate 200.

Beneficial effects of the present disclosure are that: the COA substrate and the method of fabricating the same provided by the present disclosure provided by the present disclosure use a half tone mask to expose the second passivation layer, thereby ensuring that during a subsequent etching operation, a part of the color resist layer is etched at the same time when the second passivation layer is etched away, such that the taper angle of the formed opening is reduced. Therefore, the taper angle is reduced when the pixel electrode is deposited, the phenomenon of uneven coverage, relatively large resistance, or even disconnection is avoided when the pixel electrode is deposited, which improves a quality of the COA substrate.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A method of fabricating a color-filter on array (COA) substrate, comprising steps of:
    a step S10 of forming a gate electrode on a base substrate;
    a step S20 of forming a gate electrode insulating layer on the base substrate and the gate electrode;
    a step S30 of forming an active layer on the gate electrode insulating layer;
    a step S40 of forming an ohmic contact layer on the active layer;
    a step S50 of forming a source electrode and a drain electrode on the ohmic contact layer;
    a step S60 of forming a first passivation layer on the source electrode, the drain electrode, the gate electrode insulating layer, the active layer, and the ohmic contact layer;
    a step S70 of forming a color resist layer on the first passivation layer, and forming an auxiliary through hole in the color resist layer through an exposure and development process, wherein an inner wall of the auxiliary through hole is arc-shaped;
    a step S80 of forming a second passivation layer on the color resist layer; and
    a step S90 of forming a photoresist on the second passivation layer, exposing the photoresist with a halftone mask, and sequentially forming a third through hole on the second passivation layer, forming a second through hole on the color resist layer, and forming a first through hole on the first passivation layer through an etching process, wherein the first through hole communicates with the second through hole and the second through hole communicates with the third through hole to form an opening, wherein the inner wall of the opening is a continuous arc shape, and a hole diameter of the opening gradually increases from bottom to top, wherein the halftone mask comprises a light-transmitting area, a partially light-transmitting area, and an opaque area, wherein a light transmission degree of the light-transmitting area is greater than a light transmission degree of the partially light-transmitting area, and the light transmission degree of the partially light-transmitting area is greater than a light transmission degree of the opaque area; and
    wherein the light-transmitting area is aligned to the first through hole, the partially light-transmitting area is aligned to the third through hole, and the opaque area is aligned to the second passivation layer from which the third through hole is removed.

2. The method of fabricating the COA substrate according to claim 1, wherein an upper end hole diameter of the second through hole is greater than an upper end hole diameter of the auxiliary through hole.

3. The method of fabricating the COA substrate according to claim 1, further comprising a step S100 of: peeling off the photoresist, and forming a pixel electrode on the second passivation layer, the inner wall of the opening, and the drain electrode aligned to the first through hole by a physical vapor deposition process, wherein the pixel electrode is connected to the drain electrode through the opening.

4. The method of fabricating the COA substrate according to claim 1, wherein the photoresist is a positive photoresist.

5. The method of fabricating the COA substrate according to claim 1, wherein the etching process in the step S90 is dry etching.

6. The method of fabricating the COA substrate according to claim 1, wherein an upper end hole diameter of the second through hole is greater than an upper end hole diameter of the auxiliary through hole.

7. A method of fabricating a color-filter on array (COA) substrate, comprising steps of:
    a step S10 of forming a gate electrode on a base substrate;
    a step S20 of forming a gate electrode insulating layer on the base substrate and the gate electrode;
    a step S30 of forming an active layer on the gate electrode insulating layer;
    a step S40 of forming an ohmic contact layer on the active layer;
    a step S50 of forming a source electrode and a drain electrode on the ohmic contact layer;
    a step S60 of forming a first passivation layer on the source electrode, the drain electrode, the gate electrode insulating layer, the active layer, and the ohmic contact layer, wherein in the step S60, the first passivation layer is formed by a chemical vapor deposition process;
    a step S70 of forming a color resist layer on the first passivation layer, and forming an auxiliary through hole in the color resist layer through an exposure and development process, wherein an inner wall of the auxiliary through hole is arc-shaped;
    a step S80 of forming a second passivation layer on the color resist layer; and
    a step S90 of forming a photoresist on the second passivation layer, exposing the photoresist with a halftone mask, and sequentially forming a third through hole on the second passivation layer, forming a second through hole on the color resist layer, and forming a first through hole on the first passivation layer through an etching process, wherein the first through hole communicates with the second through hole and the second through hole communicates with the third through hole to form an opening, wherein the inner wall of the opening is a continuous arc shape, and a hole diameter of the opening gradually increases from bottom to top, wherein the halftone mask comprises a light-transmitting area, a partially light-transmitting area, and an opaque area, wherein a light transmission degree of the light-transmitting area is greater than a light transmission degree of the partially light-transmitting area, and the light transmission degree of the partially light-transmitting area is greater than a light transmission degree of the opaque area; and wherein the light-transmitting area is aligned to the first through hole, the partially light-transmitting area is aligned to the third through hole, and the opaque area is aligned to the second passivation layer from which the third through hole is removed.

8. The method of fabricating the COA substrate according to claim 7, wherein an upper end hole diameter of the second through hole is greater than an upper end hole diameter of the auxiliary through hole.

9. The method of fabricating the COA substrate according to claim 7, further comprising a step S100 of: peeling off the photoresist, and forming a pixel electrode on the second passivation layer, the inner wall of the opening, and the drain electrode aligned to the first through hole by a physical vapor deposition process, wherein the pixel electrode is connected to the drain electrode through the opening.

10. The method of fabricating the COA substrate according to claim 7, wherein the photoresist is a positive photoresist.

11. The method of fabricating the COA substrate according to claim 7, wherein the etching process in the step S90 is dry etching.

12. The method of fabricating the COA substrate according to claim 7, wherein an upper end hole diameter of the second through hole is greater than an upper end hole diameter of the auxiliary through hole.

* * * * *